United States Patent
Saitou

(10) Patent No.: US 6,346,859 B1
(45) Date of Patent: *Feb. 12, 2002

(54) MICROWAVE AMPLIFIER WITH REDUCED BEAT NOISE

(75) Inventor: Shigeru Saitou, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,913

(22) Filed: Oct. 29, 1998

(30) Foreign Application Priority Data

Oct. 29, 1997 (JP) ............................................... 9-297601

(51) Int. Cl.$^7$ ............................... H03F 3/60; H03H 7/00
(52) U.S. Cl. ...................... 330/286; 330/295; 330/302; 330/306; 333/176; 333/204; 333/218; 333/219
(58) Field of Search ................................. 330/286, 295, 330/302, 306; 337/176, 204, 218, 219, 185, 184

(56) References Cited

U.S. PATENT DOCUMENTS

| | | | |
|---|---|---|---|
| 5,272,450 A | * 12/1993 | Wisherd | 330/297 |
| 5,274,341 A | * 12/1993 | Sekine et al. | 330/269 |
| 5,745,857 A | * 4/1998 | Maeng et al. | 455/553 |
| 5,945,892 A | * 8/1999 | Kato et al. | 333/185 |
| 5,999,058 A | * 12/1999 | Saitou | 330/302 |

FOREIGN PATENT DOCUMENTS

| | | | |
|---|---|---|---|
| JP | 6188654 | * | 7/1994 |
| JP | 10-233638 | | 9/1998 |

OTHER PUBLICATIONS

Samuel Y. Liao "Microwave Devices and Circuits" Prentice–Hall, Inc. Copyright 1980 Received Sep. 12, 1980 pp 2.*

Hayt, Jr. et al. "Engineering Circuit Analysis" McGraw–Hill Copyright 1978 pp 154–155.*

Japanese Office Action dated Apr. 12, 2000, with partial English translation; "Filter Design Method Used For Frequency Band" Transistor Technology Magazine, Feb. 1988, pp. 403–412.

* cited by examiner

Primary Examiner—Michael B Shingleton
(74) Attorney, Agent, or Firm—McGinn & Gibb, PLLC

(57) ABSTRACT

A microwave amplifier includes a bias circuit including a micro-strip line and a capacitor for biasing an output line of a FET with a DC voltage, and a filter block implemented by a low-pass-filter or a band-rejection-filter and a capacitor serially connected between the output line and the ground. The filter block passes a beat frequency generated by two of the carrier signals included in the input signal of the FET while maintaining the carrier signals on the output line.

20 Claims, 11 Drawing Sheets

MICROWAVE AMPLIFIER WITH REDUCED BEAT NOISE

BACKGROUND OF THE INVENTION

(a) Field of the Invention

The present invention relates to a reduced beat noise microwave amplifier and, more particularly, to a microwave amplifier for amplifying microwave signal including a plurality of different carrier frequencies.

(b) Description of the Related Art

In general, a satellite communication system uses microwave (very-high-frequency wave) carrier modulated with relatively low frequency input signal. In the transmitter of the satellite communication system, the microwave signal is amplified with a high gain using a microwave amplifier including an active elements implemented by FETs. In the conventional microwave amplifier, a suitable DC bias voltage is applied to the active elements through a micro-strip line or $\lambda g/4$ line which acts as a high impedance element against the carrier frequencies in the microwave signal. "$\lambda g$" means the wavelength of the microwave signal.

FIG. 1 shows a circuit diagram of a portion of a microwave amplifier, and FIG. 2 is a top plan view of the circuit portion of FIG. 1. FET 10 has a drain connected to a terminal of $\lambda g/4$ line 11, the other terminal of which is connected to a DC source line for applying a bias voltage $V_{DS}$ and to the ground through a capacitor 12 which passes low frequency components.

The $\lambda g/4$ line 11 and the capacitor function as a DC bias circuit for applying the DC bias voltage $V_{DS}$ to the drain of the FET 10, which has a high impedance against the carrier frequencies. Such a configuration is described in Patent Publication JP-B-2-61175, for example.

In the conventional DC bias circuit as described above, although the $\lambda g/4$ line 11 has a low resistance component R and advantageously provides a low voltage drop across the $\lambda g/4$ line 11, the reactance component jX in the $\lambda g/4$ line is not considered in connection with low frequency beat components when the microwave signal includes a plurality of carrier waves. A combination of the low frequency beat and the reactance component jX of the DC bias circuit in the beat frequency range generates a significant voltage drop in the bias voltage $V_{DS}$.

For example, when two carrier signals having carrier frequencies f1 and f2 (f1<f2) are mixed, a beat component is generated having a frequency of f2-f1, which causes a fluctuation in the bias current supplied to the drain of the FET 10.

The $\lambda g/4$ line passing the bias current has an impedance R+jX, which provides a drain voltage $V_{DS}(t)$ to the FET 10 as follows:

$$V_{DS}(t)=V_{DS}-I_D(t)\times(R+jX) \quad (1),$$

Wherein $I_D(t)$ is the current passing the thorough the $\lambda g/4$ line to the drain.

If a beat component is generated, the drain voltage $V_{DS}(t)$ of the FET 10 fluctuates based on the $I_D(t)$, the resistance component R and the reactance component jX, according to the equation (1). It is found by the inventor that the output of the microwave amplifier involves such a distortion due to the fluctuation in the DC bias voltage caused by the beat component.

SUMMARY OF THE INVENTION

It is an object of the present invention to provide a microwave amplifier capable of reducing a signal distortion caused by the beat component which is generated from a plurality of carrier waves.

The present invention is directed to a microwave amplifier includes an active element such as FET for receiving an input microwave signal including a plurality of carrier waves having carrier frequencies through an input terminal of the active element to output an amplified signal through an output terminal of the active element. The microwave amplifier of the present invention includes a filter block having first and second terminals, the first terminal being connected to one of the input terminal and the output terminal, and at least one first capacitor connected between the second terminal and a ground line, the filter block exhibiting a first impedance at the carrier frequencies and a second impedance at a beat frequency generated from the carrier waves, the first impedance being higher than the second impedance.

In accordance with the microwave amplifier of the present invention, the filter block and the capacitor pass therethrough the beat component generated by a plurality of carrier waves to the ground while maintaining the microwave signals, thereby reducing the signal distortion based on the beat component.

The above and other objects, features and advantages of the present invention will be more apparent from the following description, referring to the accompanying drawings.

PREFERRED EMBODIMENTS OF THE INVENTION

Figure 1:
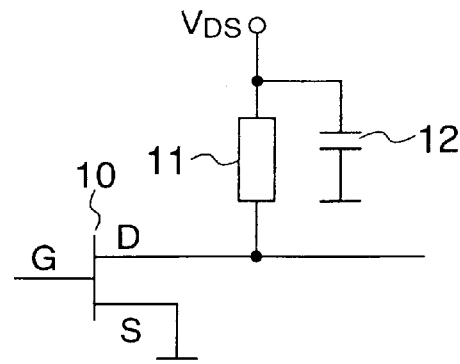
FIG. 1 is a partial circuit diagram of a conventional microwave amplifier.
Figure 2:
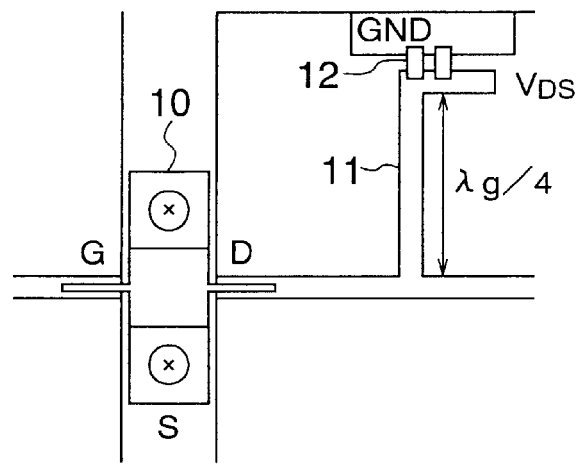
FIG. 2 is a top plan view of the portion of the microwave amplifier of FIG. 1.

Now, the present invention is more specifically described with reference to accompanying drawings, wherein similar constituent elements are designated by similar reference numerals throughout the drawings.

Figure 3:
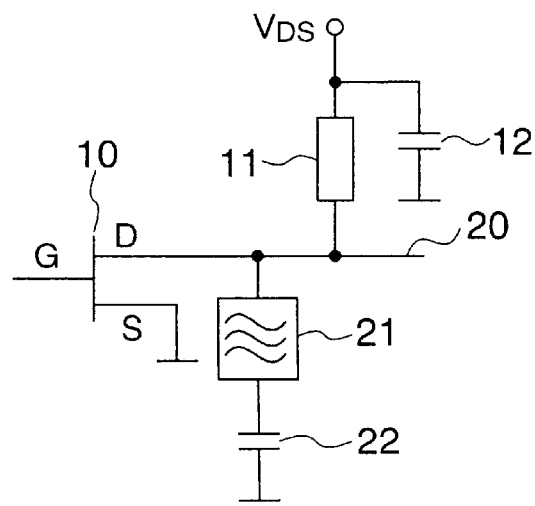
FIG. 3 is a partial circuit diagram of a microwave amplifier according to a principle of the present invention.

Referring to FIG. 3, a microwave amplifier according to the principle of the present invention includes an active element or a FET 10 having a gate (G) constituting an input terminal for receiving an input signal, a source (S) connected to the ground, and a drain (D) connected to an output line 20, and a DC bias circuit including a λg/4 line 11 connected between a source line $V_{DS}$ and the output line 20 and a capacitor 12 connected between the source line $V_{DS}$ and the ground, which are similar to those in the conventional microwave amplifier. The microwave amplifier according to the principle of the present invention further includes a filter block 21 and a capacitor 22 serially connected between the output line 20 and the ground. One of the terminals of the filter block 21 is connected to a portion of the output line 20 in the vicinity of the drain of the FET 10.

The filter block 21 exhibits a high impedance at the frequency $f_0$, corresponding to wavelength λg, of a carrier for a microwave signal, and a low impedance at the beat frequency $f_B$ of the beat generated by a plurality of carrier frequencies. The capacitor 22 passes the beat frequency component to the ground. The DC bias circuit exhibits a high impedance at the carrier frequency so that leakage of the microwave input signal toward the DC source line $V_{DS}$ is prevented.

In the configuration wherein the filter block 21 is disposed in the vicinity of the drain of the FET 10, the beat component can be effectively drained to the ground due to the low inductance between the drain and the ground. It is therefore preferable that the distance between the drain and the filter block 21 be as small as possible, whereas the terminal of the λg/4 line 11 may be connected to any point of the output line 20.

Figure 4:
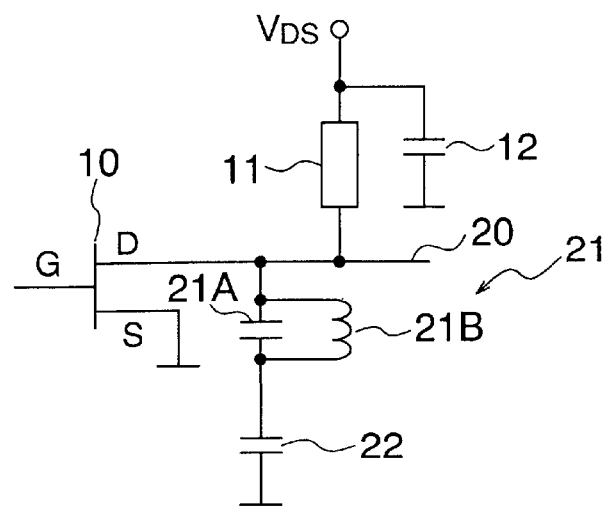
FIG. 4 is a partial circuit diagram of a microwave amplifier according to a first embodiment of the present invention.

Referring to FIG. 4 showing a microwave amplifier according to a first embodiment of the present invention, the filter block 21 in FIG. 3 is implemented by an LC parallel resonant circuit including a capacitor 21A and an inductor (or inductance element) 21B connected in parallel. In this configuration, the impedance as viewed from the drain of the FET 10 toward the ground is very high (substantially open) at the carrier frequency due to the LC resonance at the carrier frequency, and low at the beat frequency because the LC resonance is not effected in the vicinity of the beat frequency.

In the first embodiment, the number of circuit components and the circuit scale can be small due to the simple structure of the filter block 21 and the high-capacitance capacitor 22.

Figure 5:
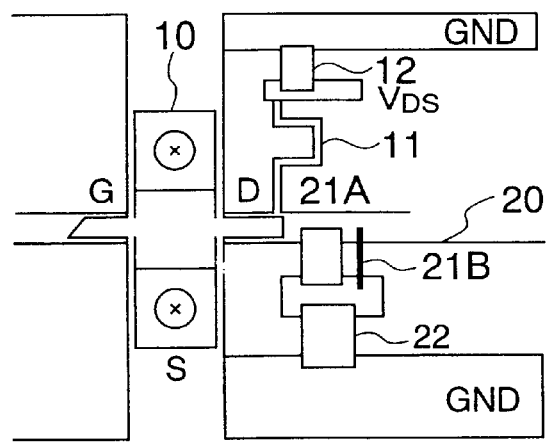
FIG. 5 is a top plan view of the portion of the microwave amplifier of FIG. 4.
Figure 6:
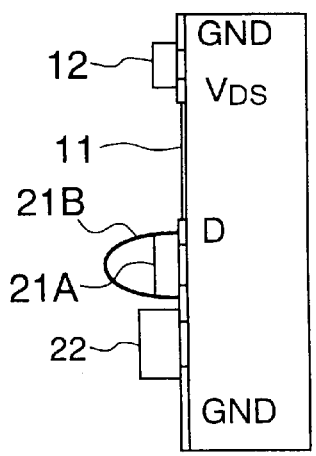
FIG. 6 is a side view of the portion of the microwave amplifier of FIG. 4.

Referring to FIGS. 5 and 6 showing the structure of the microwave amplifier of FIG. 4, the inductance element 21B is implemented by a bonding wire for bonding the output line 20 in the vicinity of the drain of the FET 10 with a terminal of the capacitor 22, thereby providing a simple structure for the microwave amplifier.

The capacitance C and the inductance L of the LC resonant circuit 21 can be calculated from the carrier frequency $f_0$ by the following equation:

$$f_0 = \frac{1}{2\pi\sqrt{LC}} \quad (2)$$

The capacitor 22 can be implemented by a chip capacitor (discreet hexahedron capacitor) having a large capacitance, wherein the capacitance $C_{22}$ thereof is selected to exhibit a substantially zero impedance at the beat frequency.

Assuming that $f_B$=10 MHz and $C_{22}$=1μm, the impedance Z of the capacitor 22 is obtained as follows:

$$Z = \frac{1}{2\pi \times f_B \times C_2} = 0.02\,\Omega,$$

Thus, a suitable low impedance at the beat frequency can be obtained.

Figure 7:
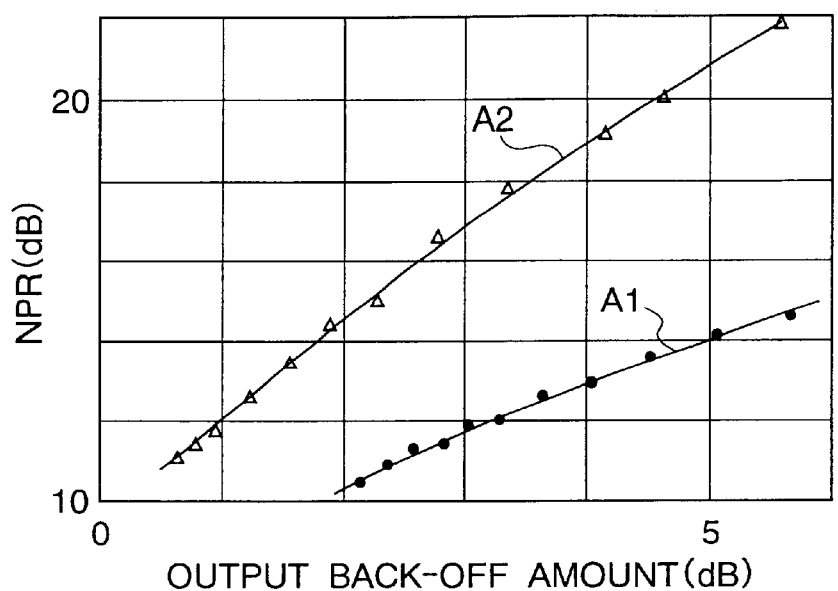
FIG. 7 is a graph for showing the relationship between NPR and an output back-off amount.

Referring to FIG. 7 showing NPR (noise-to-power ratio) characteristics as the relationship between NPR (dB) and the output back-off amount (dB) for comparing a case of the micro-strip line having a length of λg/4 (A1 curve) with a case of the LC parallel resonant circuit (A2 curve). The output back-off amount is used to define an operational point of the output, which is determined as a back-off amount estimated from a saturation point. The term NPR characteristics as used herein is known as a performance index for showing the linearity of a power amplifier. When a plurality of signal waves are applied to the input of a typical amplifier, the amplifier delivers a plurality of undesirable output components in addition to the desired output components due to the distortion in the amplifier, which generally degrades the output signal quality of the amplifier.

Especially, in a mobile communication system, the number of stations is large and, therefore, a single amplifier operates for amplification of a large number of signal frequencies. It is difficult, however, to test the linearity in such an amplifier, because a large number of signal generators must be provided for the input signals in the test and it is in fact impractical. It is proposed to test the linearity in the amplifier by using a noise signal as described below.

The proposed test uses a noise signal including a slit band, which does not contain a noise component, among a noise frequency band including noise components. The noise signal is input for testing an amplifier, the output of which is examined as to the ratio between the power density in the slit band and the power density in the noise frequency band. A measured rate of the power density measured in the slit band relative to the power density in the noise frequency band can exhibit a degradation of the linearity in the amplifier. The ratio is generally called NPR, wherein a larger absolute value of NPR means a smaller distortion, or a better linearity, in the amplifier which amplifies a plurality of input frequencies.

The LC parallel resonant circuit 21 used in the first embodiment as the filter block exhibits a smaller reactance jX compared to the λg/4 micro-strip line 11. The capacitor 22 disposed for passing the beat frequency components reduces the beat on the output line 20 caused by a plurality of carrier frequencies.

In FIG. 7, it is understood that the NPR characteristics of the present embodiment shown by A2 curve are improved over the conventional microwave amplifier shown by A1 curve in a wide range of the output back-off amount.

Figure 8A:
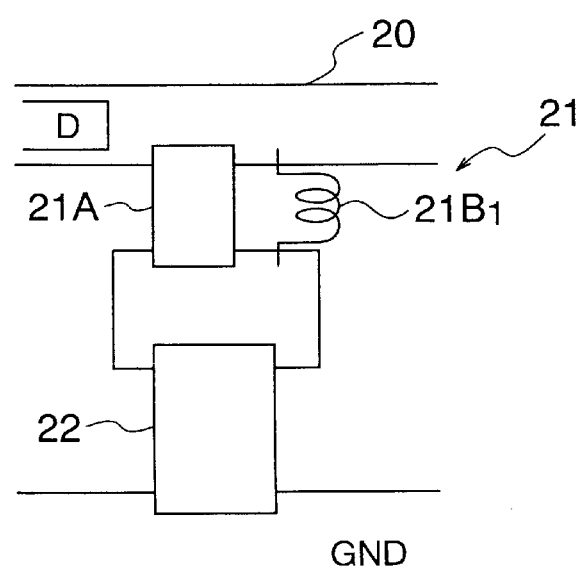
FIGS. 8A, 8B and 8C are schematic top plan views of examples of the inductance in FIG. 4.
Figure 8B:
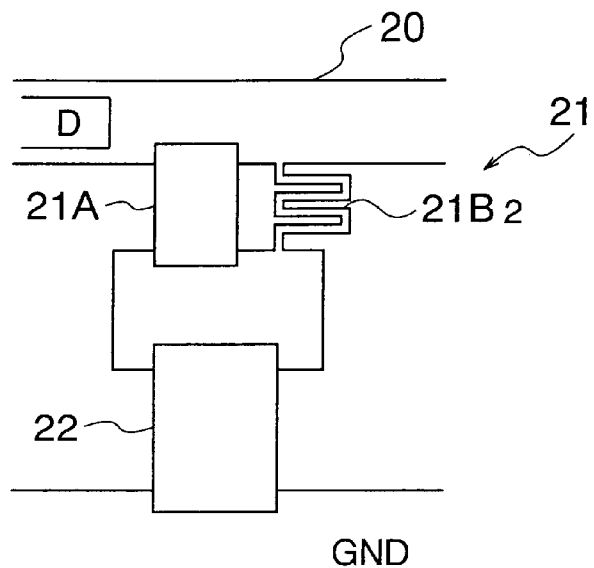
Figure 8C:
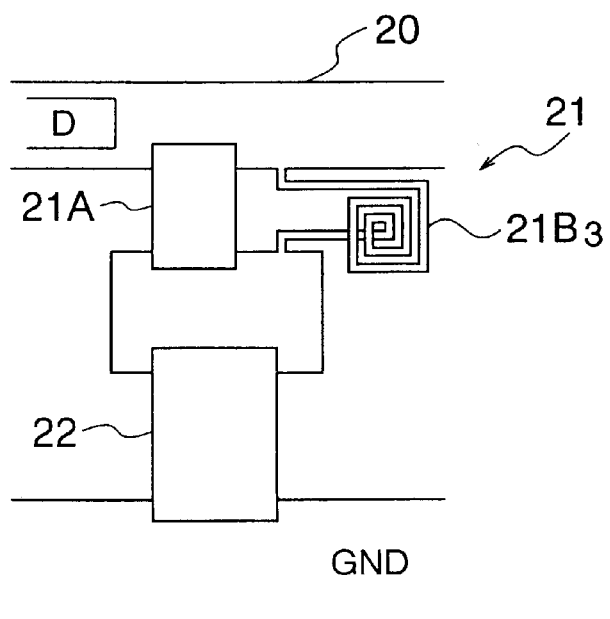

Referring to FIGS. 8A, 8B and 8C, inductor 21B can be implemented by a coil wire $21B_1$ (FIG. 8A), a meander interconnect pattern $21B_2$ (FIG. 8B), or a spiral interconnect pattern $21B_3$ (FIG. 8C). The coil wire 21B, has an advantage of a relatively large inductance, whereas the meander and spiral interconnect patterns $21B_2$ and $21B_3$ have an advantage of reduction of cost of the material and the number of fabrication steps.

Figure 9:
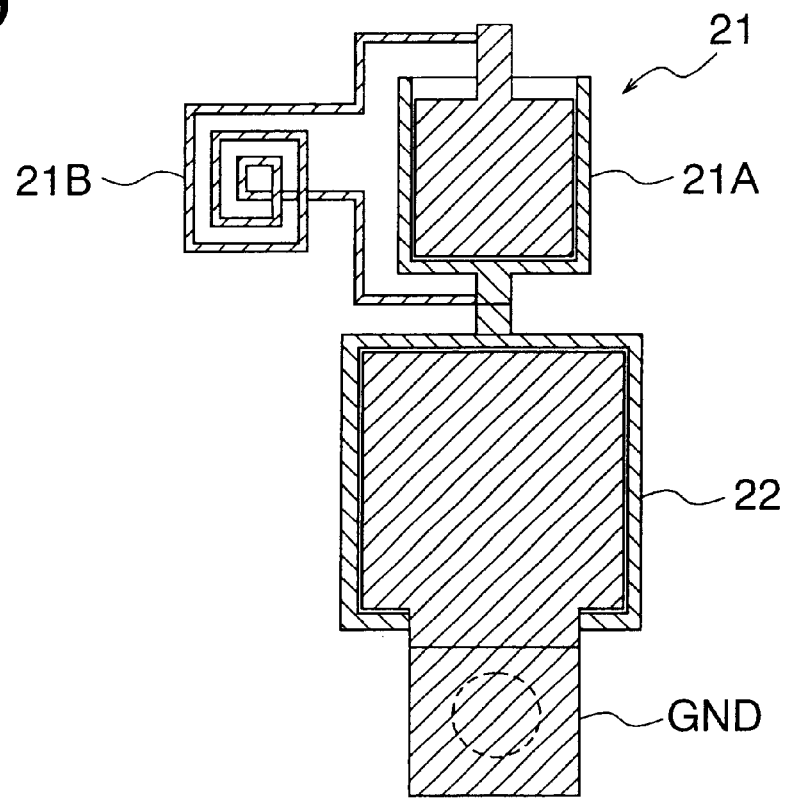
FIG. 9 is a schematic top plan view of the capacitor in FIG. 4.
Figure 10:
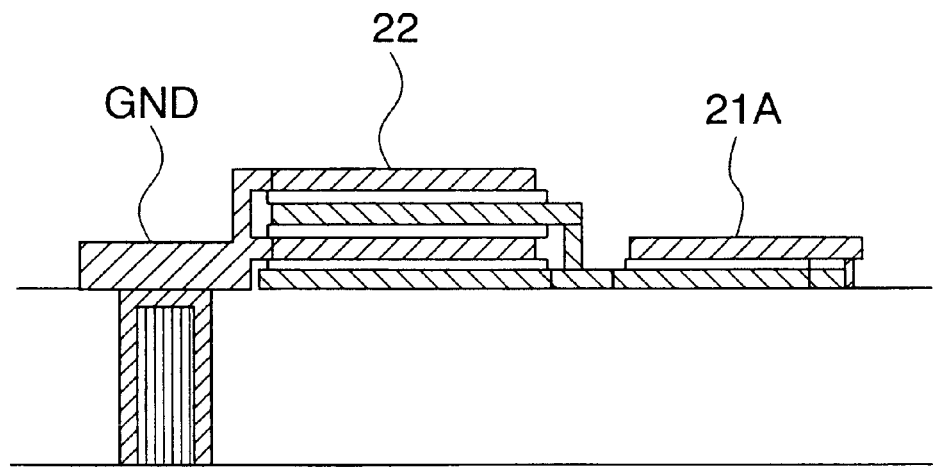
FIG. 10 is a cross-sectional view of the capacitor of FIG. 9.

Referring to FIGS. 9 and 10, the microwave amplifier according to the first embodiment is implemented on a monolithic microwave integrated circuit (MMIC), wherein electrodes made of interconnect patterns are laminated one on another so that the capacitor 21A is formed on the substrate. In this configuration, circuit components can be formed on the substrate by a thin film technology to reduce the cost and the parts of the microwave amplifier.

Figure 11:
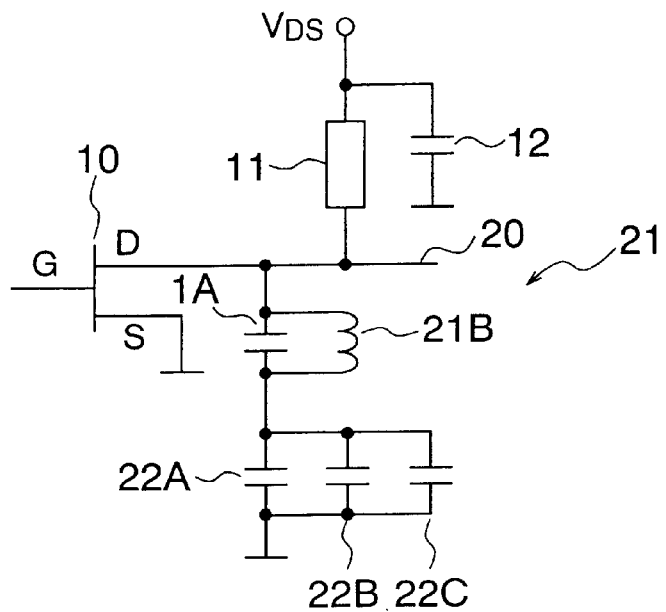
FIG. 11 is a partial circuit diagram of a microwave amplifier according to a second embodiment of the present invention.
Figure 12:
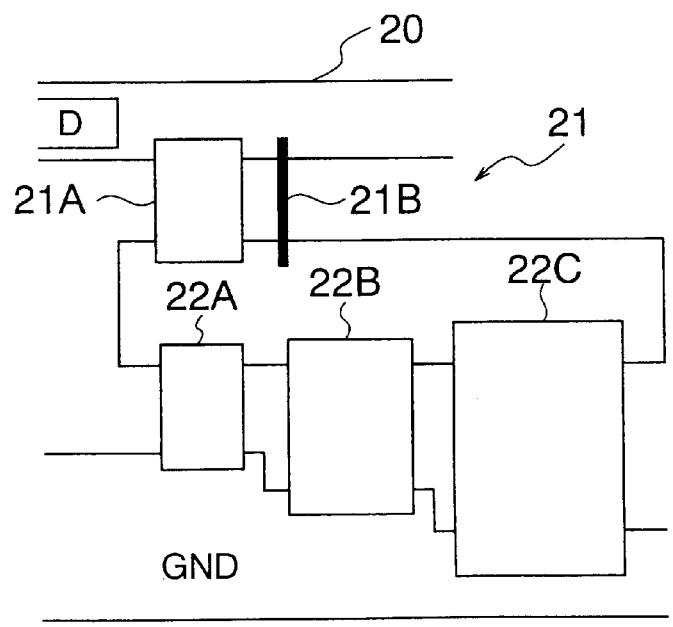
FIG. 12 is a schematic top plan view of the portion of the microwave amplifier of FIG. 11.

Referring to FIGS. 11 and 12, a microwave amplifier according to a second embodiment of the present invention includes a plurality of capacitors 22A, 22B and 22C connected in parallel instead of the high-capacitance capacitor 22 in FIG. 4. The parallel capacitors 22A, 22B and 22C reduce the circuit scale for the microwave amplifier. In this configuration, one of the capacitors having a smaller capacitance is disposed nearer to the filter block 21 than another of the capacitors having a larger capacitance. In addition, a relatively higher beat frequency component among the plurality of beat frequency components is attenuated by the capacitor 22A disposed in the vicinity of the filter block 21, whereas a relatively lower beat frequency component is attenuated by the capacitor 22C disposed away from the filter block 21. Accordingly, self-resonance degradation of the capacitor, especially self-resonance degradation of the larger-capacitance capacitor 22C, due to the self-resonance in the higher frequency range can be reduced.

Figure 13:
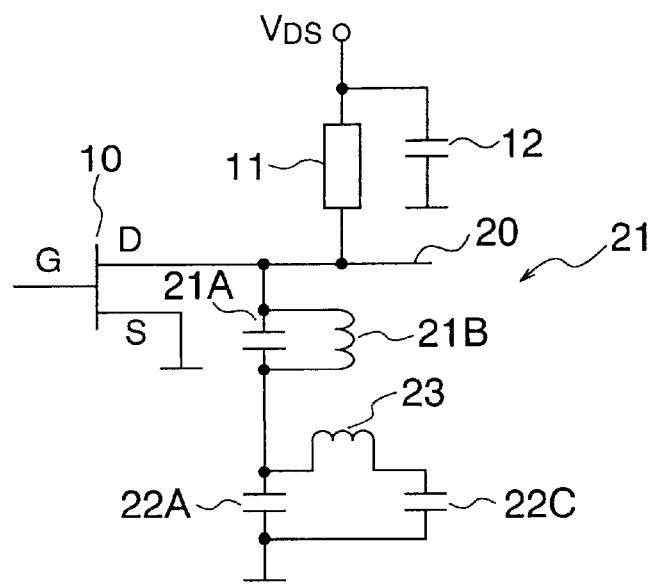
FIG. 13 is a partial circuit diagram of a modification from the microwave amplifier of FIG. 11.
Figure 14:
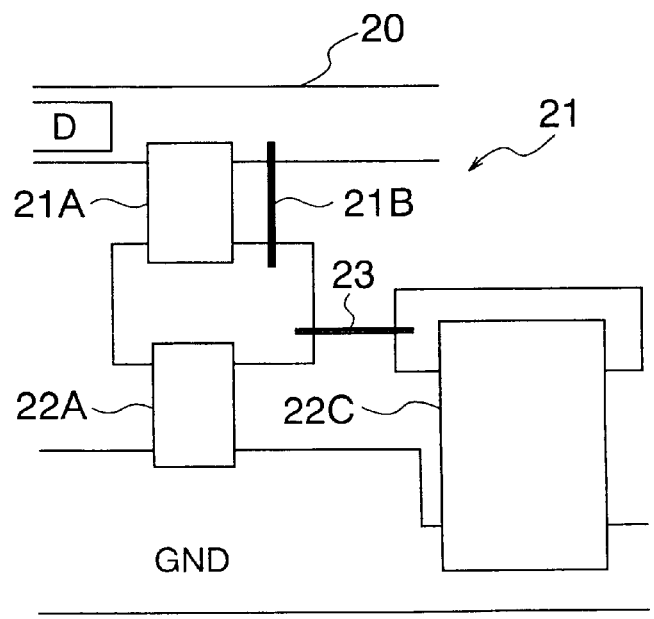
FIG. 14 is a schematic top plan view of the portion of the microwave amplifier of FIG. 13.

Referring to FIGS. 13 and 14, showing a modification of the microwave amplifier of FIGS. 11 and 12, another inductance element 23 is connected between a terminal of the low capacitance capacitor 22A and a terminal of the high capacitance capacitor 22C after eliminating the capacitor 22B. The inductance element 23 thus provided protects the larger-capacitance capacitor 22C against the degradation thereof due to the LC resonance, by cutting off the higher frequency components from the capacitor 22C.

Figure 15:
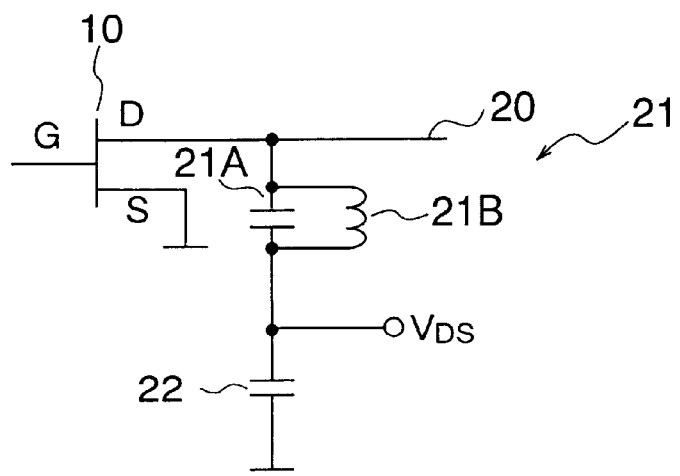
FIG. 15 is a partial circuit diagram of a microwave amplifier according to a third embodiment of the present invention.
Figure 16:
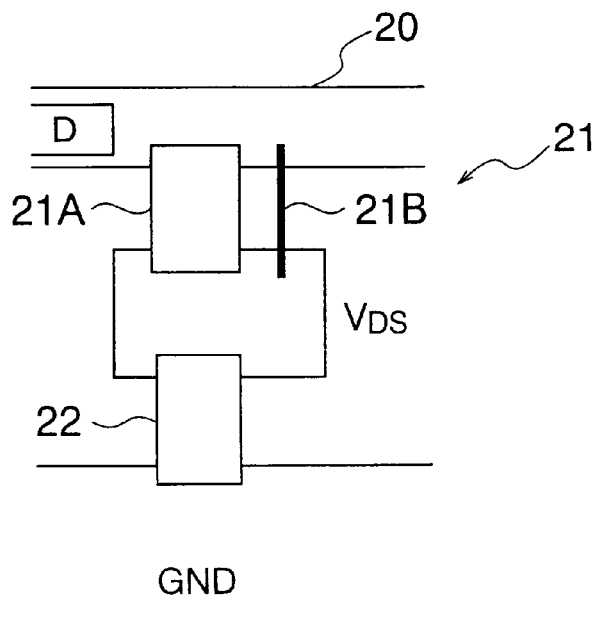
FIG. 16 is a schematic top plan view of the portion of the microwave amplifier of FIG. 15.

Referring to FIGS. 15 and 16, a microwave amplifier according to a third embodiment of the present embodiment is similar to the first embodiment, except that the DC bias voltage $V_{DS}$ is applied at the node connecting the capacitor 22 and the filter block 21, and thus applied to the drain of the FET 10 through the filter block 21.

In the present embodiment, a high impedance can be obtained at the carrier frequencies, similarly to the first embodiment. Accordingly, leakage of the microwave signal toward the DC source line $V_{DS}$ can be prevented. In addition, since all the circuit components can be disposed physically at one side of the output line 20 in the present embodiment, as shown in FIG. 16, the occupied area for the microwave amplifier can be reduced.

Figure 17:
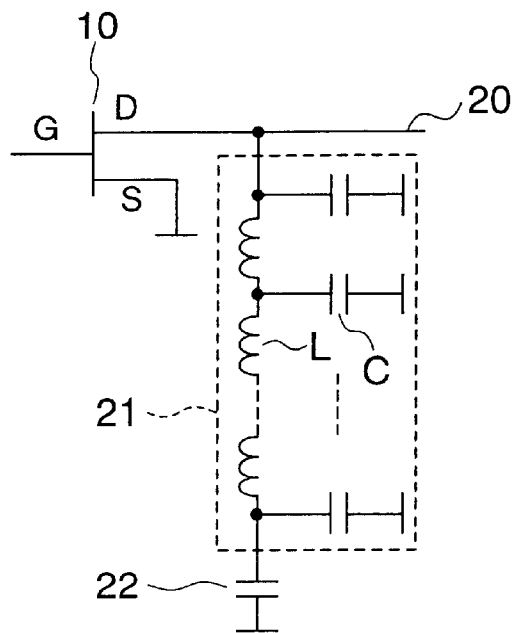
FIG. 17 is a partial circuit diagram of a microwave amplifier according to a fourth embodiment of the present invention.

Referring to FIG. 17, a microwave amplifier according to a fourth embodiment of the present invention has a filter block 21 implemented by a band rejection filter (BRF) including a single inductor (L) and a pair of capacitors (C) each connected between a corresponding terminal of the inductor (L) and the ground, or a plurality of inductors (L) connected in series and a plurality of capacitors (C) each connected between a corresponding terminal of one of the inductors and the ground, to form a π circuit.

Figure 18:
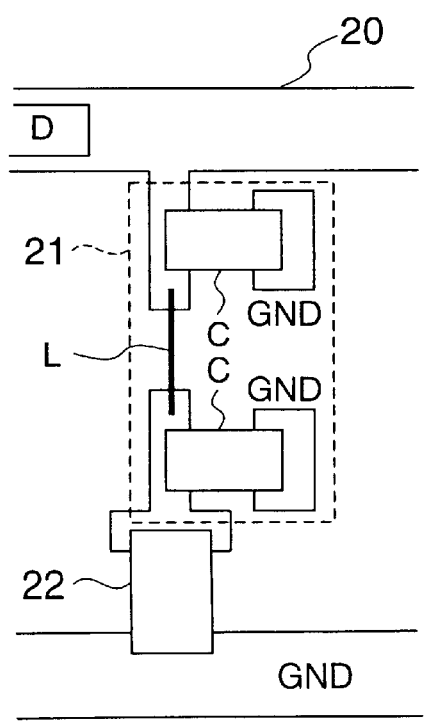
FIG. 18 is a schematic top plan view of the portion of the microwave amplifier of FIG. 18.

Referring to FIG. 18, there is shown the microwave amplifier of FIG. 17 in the case of a single inductor (L), wherein the inductor (L) is implemented by a bonding wire and the pair of capacitors (C) are implemented by chip capacitors. By combining suitable impedances and capacitances in the configuration of the present embodiment, a high impedance can be obtained in a wider frequency range compared to the first embodiment.

Figure 19:
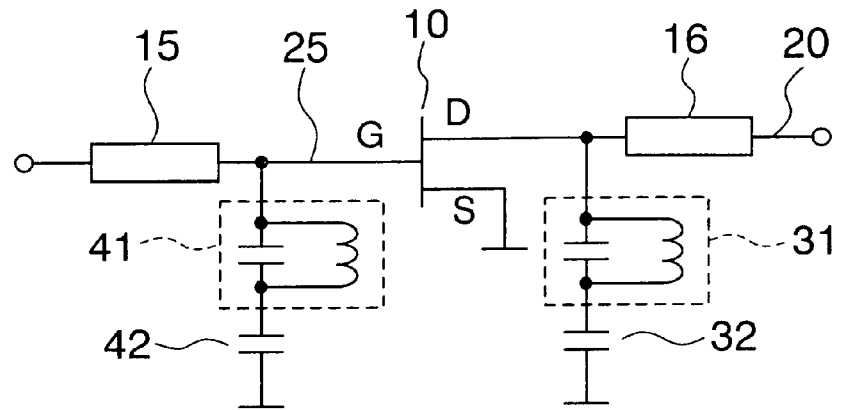
FIG. 19 is a partial circuit diagram of a microwave amplifier according to a fifth embodiment of the present invention.

Referring to FIG. 19, a microwave amplifier according to a fifth embodiment of the present invention has a first filter block 31 and a first capacitor 32 serially connected between the drain (20) of the FET 10 and the ground, similarly to the first embodiment, and a second filter block 41 and a second capacitor 42 serially connected between the gate (25) of the FET 10 and the ground. In the present embodiment, beat noise can be attenuated at the input side of the FET 10 in addition to the output side of the FET 10, thereby effectively reducing the output distortion caused by the beat noise. In a modification of the present embodiment, the first filter block 31 and the first capacitor 32 may be omitted.

Figure 20:
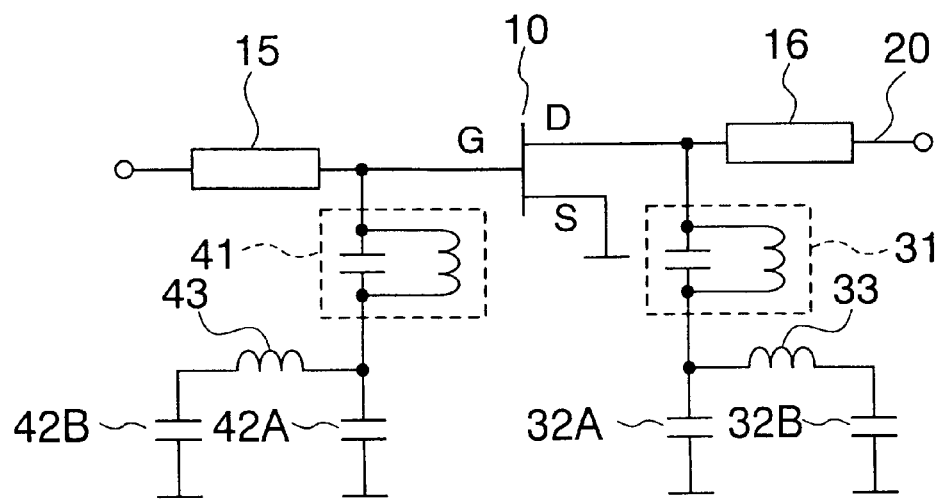
FIG. 20 is a partial circuit diagram of a modification from the microwave amplifier of FIG. 19.

Referring to FIG. 20, a microwave amplifier modified from the fifth embodiment has a configuration similar to that described with reference to FIG. 13. Specifically, The capacitors 32 and 42 in FIG. 19 are replaced by respective π connections each including a pair of capacitors 32A (42A) and 32B (42B) and an inductor 33 (43) connected between a terminal of capacitor 32A (42A) and a terminal of capacitor 32B (42B). The capacitor 32A (42A) has a smaller capacitance than the capacitor 32B (42B). By this configuration, high frequency components are cut off by the inductors 33 and 43, which prevents the degradation of the higher-capacitance capacitor 32B or 42B caused by resonance at the high frequencies. The replacement of the capacitor by the π connection may be employed only at the drain side of the FET 10 in FIG. 19. In this case, an advantage similar to that of the first embodiment can be obtained.

Figure 21:
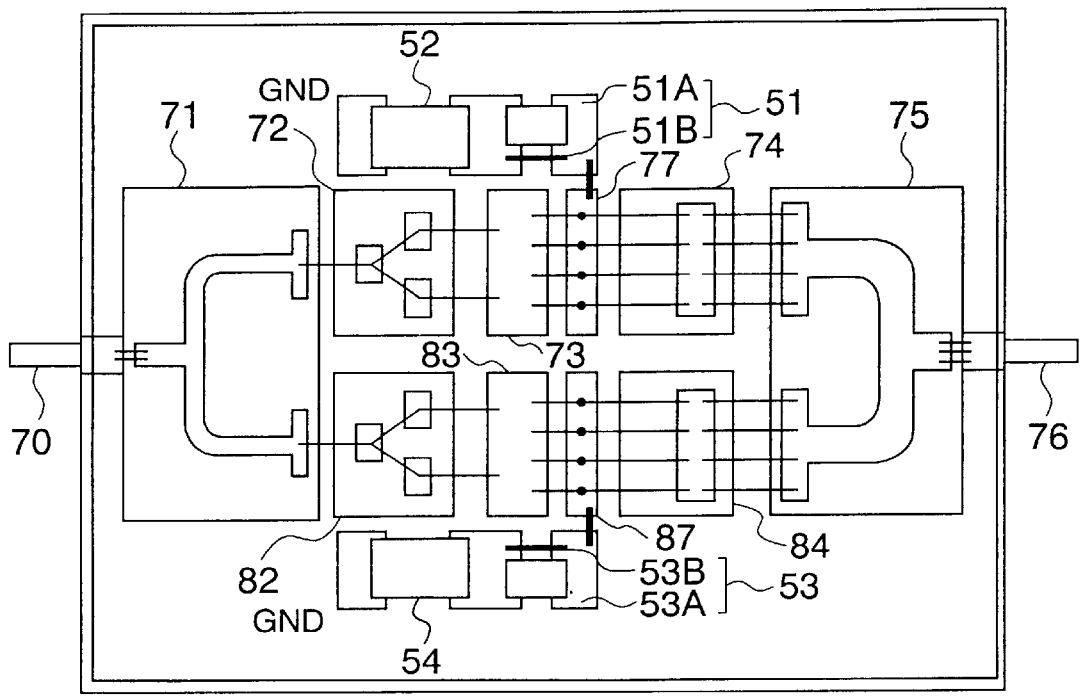
FIG. 21 is a top plan view of a portion of a microwave amplifier according to a sixth embodiment of the present invention.

Referring to FIG. 21, a microwave amplifier according to a sixth embodiment of the present invention has a pair of FETs for a parallel amplification. The microwave amplifier having an internal impedance-matching function includes a divider 71 for receiving an input signal through the input terminal 70, a pair of input matching block 72 and 82 each receiving an output signal from the divider 71, a pair of FETs 73 and 83 each for receiving an output signal from a corresponding input matching block 72 or 82, a pair of output matching blocks 74 and 84 each for receiving an output signal from a corresponding FET 73 or 83, and a combiner 75 for receiving output signals from the output matching circuits 74 and 84 for addition to deliver an output signal through an output terminal 76 of the microwave amplifier.

In operation, a microwave signal fed through the input terminal 70 is distributed by the divider 71 and supplied to both the input matching blocks 72 and 82, wherein the input signals are subjected to impedance-matching by using inductors and capacitors. The microwave signals amplified by the FETs 73 and 83 are again subjected to impedance-matching in the respective output matching blocks 74 and 84, and then added in the adder 75 to be output through the output terminal 76.

When a conventional microwave amplifier having an internal impedance-matching function receives a plurality of carrier frequencies included in the microwave signal, the carrier frequencies generate low frequency beat noise, which causes a distortion in the output signal due to the impedance of the input matching blocks 72 and 82 or output matching blocks 74 and 84, a phase shift by the transmission lines, and reactance components jX associated with the bonding wires.

In the present embodiment, a pair of bonding patterns 77 and 87 are disposed in the vicinities of the drains of the FETs 73 and 83, respectively, and connected to the respective drains. A filter block 51 or 53 is connected to a corresponding bonding pattern 77 or 87 at one end of the filter block, and a capacitor 52 or 54 is connected between the other end of the filter block 51 or 53 for passing the beat noise.

In the present embodiment, the filter block 51 is implemented by a LC resonant circuit including a capacitor 51A and an inductor 51B, whereas the filter block 53 is implemented by a LC resonant circuit including a capacitor 53A and an inductor 53B. In this case, the load impedance at the low beat frequency as viewed from the FET side generally has a larger reactance component jX due to the inductor or capacitor of the output matching blocks 74 and 84 and the transmission line of the adder 75. The parallel filter blocks as disposed in the vicinity of the drain have a function for reducing the reactance component jX.

Accordingly, the low beat frequency components caused by the plurality of carrier waves can be attenuated, thereby reducing the distortion in the output of the microwave amplifier having an internal impedance-matching function. The reduction of the distortion can be also obtained in the case of operation of a single microwave amplifier. The present invention can be also applied to a microwave amplifier having discreet components as well as a package type microwave amplifier.

Figure 22:
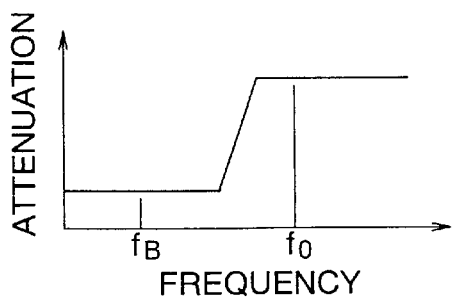
FIGS. 22A and 22B are graphs for showing the function of the filter block according to the present invention.
Figure 22:
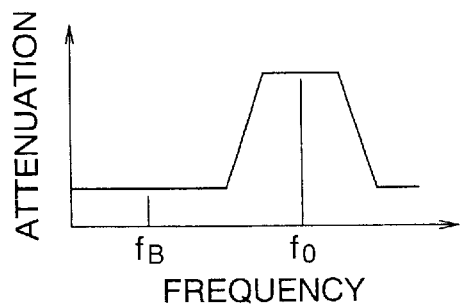

Referring to FIGS. 22A and 22B, there is shown a method for determining the inductance and the capacitance of the filter block used in the present invention. FIG. 22A shows the method when a low-pass-filter is used as the filter block, whereas FIG. 22B shows the method when a band-rejection-filter (BRF) is used as the filter block. In either case, the inductance and the capacitance should be determined so that the filter block provides a large attenuation or high impedance at the carrier frequency $f_0$, and a small attenuation or low impedance at the lower beat frequency $f_B$.

Since the above embodiments are described only for examples, the present invention is not limited to the above embodiments and various modifications or alterations can be easily made therefrom by those skilled in the art without departing from the scope of the present invention.

What is claimed is:

1. A microwave amplifier comprising:
    an active element for receiving an input microwave signal, including a plurality of carrier waves having carrier frequencies through an input terminal of said active element to output an amplifier signal through an output terminal of said active element;
    a filter block having first and second terminals, said first terminal being connected to at least one of said input terminal and said output terminal, said filter block comprising at least one LC filter;
    at least one first capacitor connected between said second terminal and a ground line; and
    a bias circuit for biasing said output terminal with a DC voltage, wherein said DC voltage and said output terminal are interconnected via one of a microstrip line and a $\lambda g/4$ line,
    wherein said filter block exhibits a first impedance at said carrier frequencies and a second impedance at a beat frequency generated from said carrier waves, said first impedance being higher than said second impedance.

2. The microwave amplifier as defined in claim 1, wherein said bias circuit is connected to a node of a source line and a second capacitor, said second capacitor being connected to ground.

3. A microwave amplifier comprising:
    an active element for receiving an input microwave signal, including a plurality of carrier waves having carrier frequencies through an input terminal of said active element to output an amplifier signal through an output terminal of said active element;
    a filter block having first and second terminals, said first terminal being connected to one of said input terminal and said output terminal;
    at least one first capacitor connected between said second terminal and a ground line; and
    a bias circuit for biasing said output terminal with a DC voltage, wherein said DC voltage and said output terminal are interconnected via one of a microstrip line and a $\lambda g/4$ line,
    wherein said filter block exhibits a first impedance at said carrier frequencies and a second impedance at a beat frequency generated from said carrier waves, said first impedance being higher than said second impedance, wherein said filter block comprises a LC resonant circuit including a second capacitor and an inductor connected in parallel and resonating in the vicinity of said carrier frequencies.

4. The microwave amplifier as defined in claim 3, wherein said inductor is implemented by a bonding wire or a coil.

5. The microwave amplifier as defined in claim 3, wherein said inductor is implemented by an interconnect pattern including a meander line or a spiral inductor.

6. The microwave amplifier as defined in claim 1, wherein said first capacitor comprises a thin film conductor patterns sandwiching an insulator film therebetween.

7. The microwave amplifier as defined in claim 1, wherein said at least one first capacitor includes a plurality of first capacitors connected in parallel to one another.

8. The microwave amplifier as defined in claim 7, wherein one of said plurality of first capacitors having a lower capacitance is connected nearer to said output terminal of said active element than another capacitor of said plurality of said first capacitors having a larger capacitance.

9. The microwave amplifier as defined in claim 8, further comprising an inductor connected between said one of said first capacitors and said another capacitor of said first capacitors.

10. The microwave amplifier as defined in claim 1, further comprising a bias circuit for applying a DC bias voltage to a node connecting said filter block and said first capacitor.

11. The microwave amplifier as defined in claim 1, wherein said filter block comprises a low-pass-filter or a band-rejection-filter.

12. A microwave amplifier comprising:
    a divider for receiving an input microwave signal including a plurality of carrier waves having carrier frequencies to output a distributed microwave signal at a pair of distributing terminals;
    a pair of input-matching circuits each having an input connected to a corresponding one of said distributing terminals for receiving said distributed microwave signal to output an input-matched signal;
    a pair of active elements each for receiving said input-matched signal to output an amplified signal through an output terminal of said each active element;

a pair of output matching circuits each for receiving said amplified signal from a corresponding one of said active elements to output an output-matching signal;

an adder for receiving said output-matching signal from each said output matching circuit for addition;

a pair of filter blocks each having first and second terminals, said first terminal being connected to one of said input terminal and said output terminal of a corresponding one of said active elements, each said filter block comprising at least one LC filter; and at least one first capacitor connected between said second terminal of a corresponding one of said active elements and a ground line, whereby each of said filter blocks exhibit a first impedance at said carrier frequencies and a second impedance at a beat frequency Generated from said carrier waves, said first impedance being higher than said second impedance, said at least one first capacitor having a predetermined high capacitance for reducing a beat component in a predetermined low frequency.

13. A microwave amplifier comprising:

an active element for receiving an input microwave signal including a plurality of carrier waves having carrier frequencies through an input terminal of said active element to output an amplified signal through an output terminal of said active element;

a filter block having first and second terminals, said first terminal being connected to at least one of said input terminal and said output terminal; and a plurality of first capacitors connected between said first terminal and the ground, said plurality of first capacitors connected in parallel to one another, one of said plurality of first capacitors having a lower capacitance connected nearer to said output terminal of said active element than another capacitor of said plurality of said first capacitors having a larger capacitance, wherein said filter block exhibits a first impedance at said carrier frequencies and a second impedance at a beat frequency generated from said carrier waves, said first impedance being higher than said second impedance.

14. The microwave amplifier as defined in claim 13, further comprising a bias circuit for biasing said output terminal with a DC voltage.

15. The microwave amplifier as defined in claim 13, wherein said filter block comprises a LC resonant circuit including a second capacitor and an inductor connected in parallel and resonating in the vicinity of said carrier frequencies.

16. The microwave amplifier as defined in claim 15, wherein said inductor comprises one of a bonding wire and a coil.

17. The microwave amplifier as defined in claim 15, wherein said inductor comprises an interconnect pattern including one of a meander line and a spiral inductor.

18. The microwave amplifier as defined in claim 13, wherein said first capacitor comprises thin film conductor patterns sandwiching an insulator film therebetween.

19. The microwave amplifier as defined in claim 13, further comprising an inductor connected between said one of said first capacitors and said another of said first capacitors, wherein said filter block comprises one of a low-pass-filter and a band-rejection-filter.

20. The microwave amplifier of claim 13, wherein said another capacitor has a predetermined high capacitance for reducing a beat component in a predetermined low frequency.

* * * * *